(12) United States Patent
Kim et al.

(10) Patent No.: US 7,427,875 B2
(45) Date of Patent: Sep. 23, 2008

(54) FLIP-FLOP CIRCUIT

(75) Inventors: Kyung-Hoon Kim, Kyoungki-do (KR); Tae-Heui Kwon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 78 days.

(21) Appl. No.: 11/478,133

(22) Filed: Jun. 30, 2006

(65) Prior Publication Data

US 2007/0080714 A1 Apr. 12, 2007

(30) Foreign Application Priority Data

Sep. 29, 2005 (KR) .................... 10-2005-0091665
Dec. 29, 2005 (KR) .................... 10-2005-0134193

(51) Int. Cl.
*H03K 19/096* (2006.01)
*H03K 3/00* (2006.01)
*H03K 3/289* (2006.01)

(52) U.S. Cl. ................... 326/46; 326/95; 327/199; 327/200; 327/201; 327/202; 327/203

(58) Field of Classification Search ........... 326/46, 326/95; 327/199–203, 208–213, 218
See application file for complete search history.

(56) References Cited

U.S. PATENT DOCUMENTS

| | | | |
|---|---|---|---|
| 5,570,051 A | 10/1996 | Chiang et al. | |
| 5,774,003 A | 6/1998 | Qureshi et al. | |
| 6,803,799 B1 | 10/2004 | Churchill et al. | |
| 6,864,733 B2 * | 3/2005 | Anshumali et al. | 327/210 |
| 6,864,735 B2 | 3/2005 | Joo | |
| 6,956,405 B2 * | 10/2005 | Lundberg | 326/95 |
| 6,968,486 B2 | 11/2005 | Matsushima | |
| 7,049,871 B2 * | 5/2006 | Tohsche | 327/197 |

(Continued)

FOREIGN PATENT DOCUMENTS

JP 10-290143 10/1998

(Continued)

OTHER PUBLICATIONS

Issue Date from the Korean Patent Office, Issued in Korean Patent Application No. 10-2005-0134193, dated on Jan. 17, 2007.

*Primary Examiner*—Rexford Barnie
*Assistant Examiner*—Thienvu V Tran
(74) *Attorney, Agent, or Firm*—McDermott Will & Emery LLP

(57) ABSTRACT

Signal delivery delay margin of a bypass flip-flop circuit is stabilized during high-frequency operation. An input controller for logically operating a bypass signal and a clock produces first and second output signals having different states depending on whether or not the bypass signal is activated. A latch circuit latches input data based on the first and second output signals. A latch controller logically operates the bypass signal and input data to generate a third output signal having a different state depending on whether or not the bypass signal is activated. An output controller is switched in response to the states of the first and second output signals for logically combining an output signal selected from the latch circuit and the third output signal to provide the output signal.

22 Claims, 4 Drawing Sheets

U.S. PATENT DOCUMENTS

| | | | |
|---|---|---|---|
| 7,145,818 B2 * | 12/2006 | Fukuoka et al. | 365/201 |
| 2003/0226079 A1 | 12/2003 | Kanba | |
| 2004/0032290 A1 * | 2/2004 | Lundberg | 327/202 |
| 2005/0254307 A1 | 11/2005 | Dietrich et al. | |
| 2005/0280459 A1 * | 12/2005 | Inoue | 327/203 |

FOREIGN PATENT DOCUMENTS

| | | |
|---|---|---|
| JP | 2001-42008 A | 2/2001 |
| JP | 2004-289030 A | 10/2004 |
| JP | 2005-24410 A | 1/2005 |
| JP | 2005-257366 A | 9/2005 |
| KR | 1999-003041 | 1/1999 |
| KR | 10-2003-0010246 | 2/2003 |
| KR | 10-2005-0109365 | 11/2005 |

\* cited by examiner

FLIP-FLOP CIRCUIT

FIELD OF THE INVENTION

The present invention relates to a flip-flop circuit; and, more particularly, to a technology capable of achieving a stable signal delivery during a high-frequency operation by improving a signal delivery delay margin of a bypass flip-flop circuit.

DESCRIPTION OF RELATED ART

Latches and flip-flops generally have been used as storage devices for storing data in digital circuits. Among those devices, the flip-flops are utilized for sequential devices that sample inputs thereto and modify their outputs at a time determined by a clock signal. In contrast, the latches are used as sequential devices that continuously observe all inputs thereto and alter their outputs at any time regardless of the clock signal.

FIGS. 1A and 1B are circuit diagrams of conventional bypass flip-flops.

Each of the conventional flip-flop circuits includes first and second latch portions 10 and 20, and a bypass portion 30.

The first latch portion 10 is provided with a transmission gate T1 for selectively outputting data DATA in response to clocks CLKB and CLK, and a latch R1 for latching an output of the transmission gate T1. The second latch portion 20 is provided with a transmission gate T2 for selectively outputting an output of the first latch portion 10 in response to the clocks CLKB and CLK, and a latch R2 for latching an output of the transmission gate T2.

The bypass portion 30 is composed of an inverter IV1 and two transmission gates T3 and T4, and selectively outputs latched data DATA or non-latched data DATA based on a logic state of a bypass signal BYPASS. In other words, if the bypass signal BYPASS is logic high, the transmission gate T4 is turned on to provide the non-latched data DATA as an output signal OUT; and if the bypass signal BYPASS is logic low, the transmission gate T3 is turned on to generate the latched data DATA as the output signal OUT.

The conventional flip-flop circuit having the structure described above outputs the data by using a multiplexer (not shown) prepared at its last stage, without control of the clocks. In this case, however, a signal path using the clocks CLK and CLKB is required to pass through the transmission gates T1 and T2 unnecessarily. In particular, if the size of a driver at the last stage is large, the size of each of the transmission gates T1 and T2 becomes large, thus causing large loading due to increase of junction capacitance.

Hence, a driver 40 is added and operated for more stable signal delivery, as shown in FIG. 1B. In such case, since a signal must pass through a total of one transmission gate and two-stage inverters IV2 and IV3 to transmit input data, there may be a time delay for the signal transmission during a high-frequency operation.

For example, if the conventional bypass flip-flop circuit operates at a frequency of 1 GHz, it is assumed that the data DATA is output at a rising edge of the clock CLK. In this case, the signal is required to go through total three inverters and one transmission gate. Accordingly, in a worst case, an approximate total delay time comes to 700 ps, which is 200 ps at each inverter plus 100 ps at the transmission gate.

Consequently, there remains 300 ps in a flight time margin of 1 ns. Considering a set-up time 100 ps of circuit that takes such data, a time to transfer along a metal line is limited to 200 ps. Thus the conventional bypass flip-flop circuit is limited in terms of operating frequency.

SUMMARY OF THE INVENTION

It is, therefore, a primary object of the present invention to provide a flip-flop circuit capable of achieving its stability in a high impedance state by using a feedback inverter of a latch.

In accordance with an aspect of the present invention, there is provided a flip-flop circuit including: an input controller for logically operating a bypass signal and a clock to produce first and second output signals having different logic states depending on whether or not the bypass signal is activated; a latch circuit for latching input data based on the first and second output signals; a latch controller for logically operating the bypass signal and the input data to generate a third output signal having a different logic state depending on whether or not the bypass signal is activated; and an output controller switched in response to the logic states of the first and second output signals for selectively outputting the signal provided from the latch circuit, and logically combining the output signal and the third output signal to provide the output signal.

Other objectives and advantages of the invention will be understood by the following description and will also be appreciated by the disclosed embodiments of the invention.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a flip-flop circuit in accordance with the present invention will be described in detail with reference to the accompanying drawings.

Figure 1A:
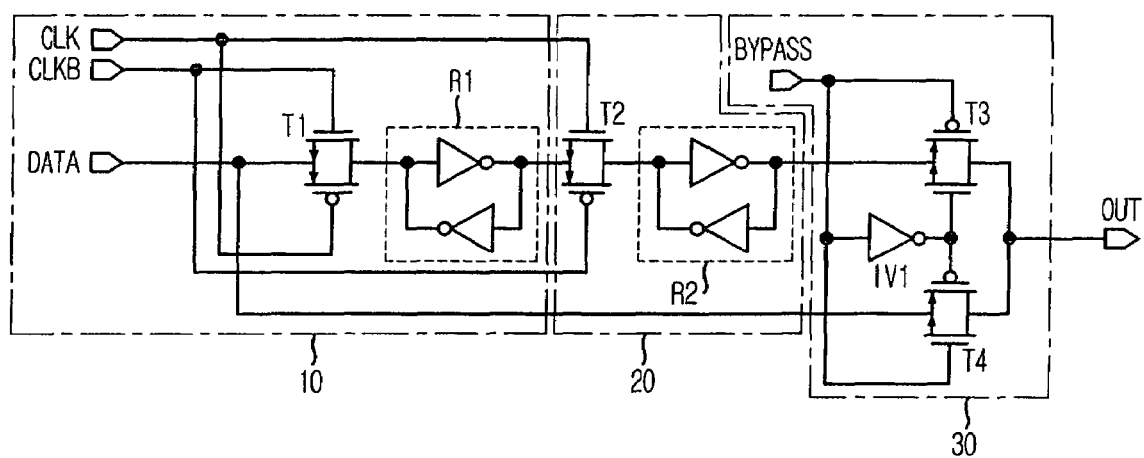
FIGS. 1A and 1B are circuit diagrams of conventional bypass flip-flop circuits.
Figure 1B:
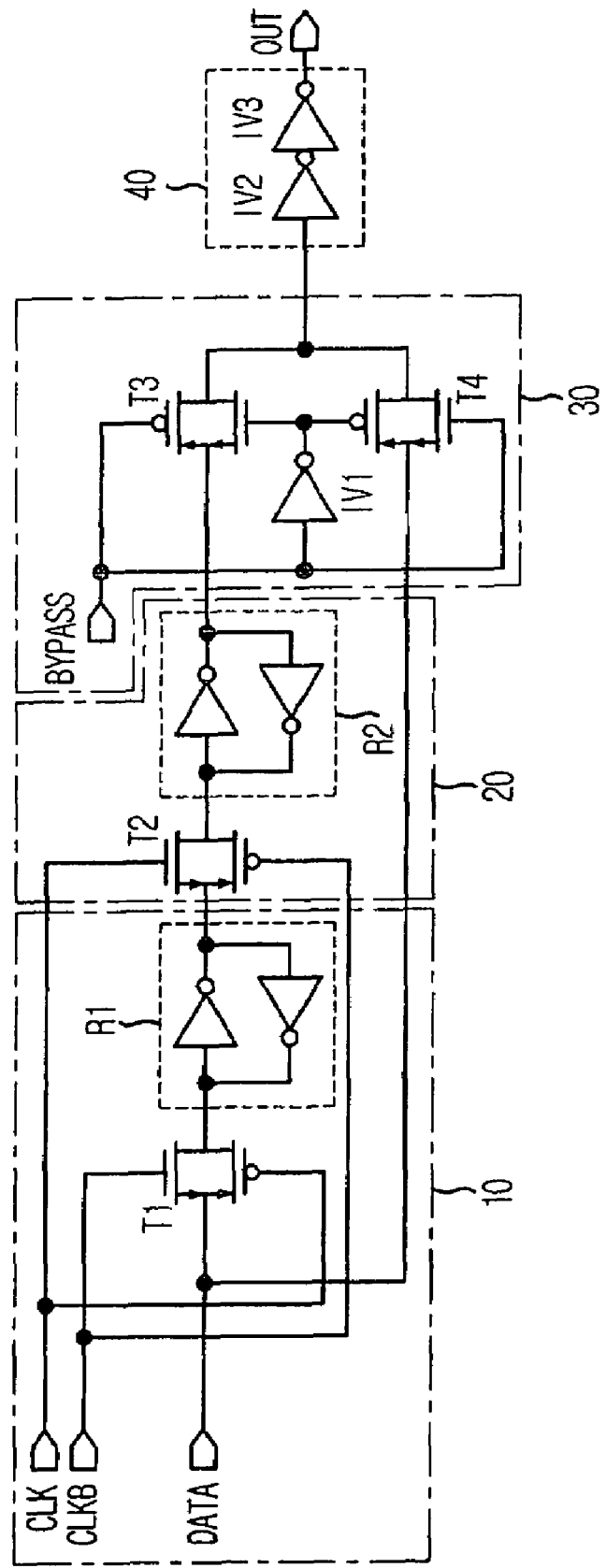
Figure 2:
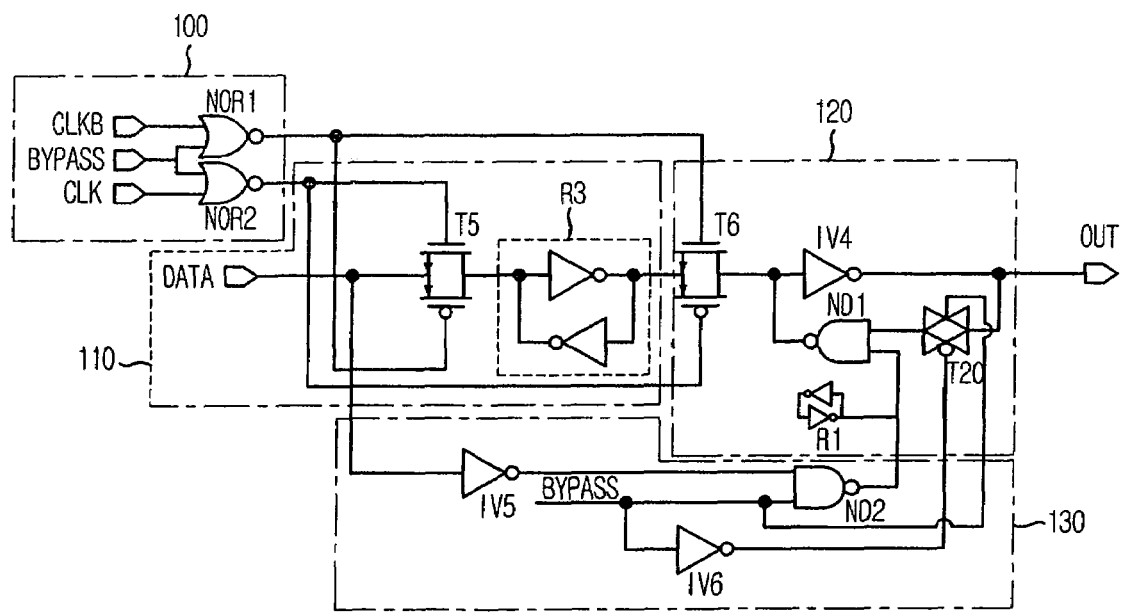
FIG. 2 is a circuit diagram of a flip-flop circuit in accordance with an embodiment of the present invention.

FIG. 2 is a circuit diagram of a bypass flip-flop circuit in accordance with an embodiment of the present invention.

The bypass flip-flop circuit of the present invention includes an input controller 100, a latch portion 110, an output controller 120 and a latch controller 130.

As shown in FIG. 2, the input controller 100 is provided with NOR gates NOR1 and NOR2 for logically operating clocks CLK and CLKB and a bypass signal BYPASS, respectively. The NOR gate NOR1 NOR-operates the clock CLKB and the bypass signal BYPASS, and the NOR gate NOR2 NOR-operates the clock CLK and the bypass signal BYPASS.

The latch portion 110 is composed of a transmission gate T5 and a latch R3. The transmission gate T5 selectively allows an output of data DATA depending on outputs of the NOR gates NOR1 and NOR2. Applied to an NMOS gate of the transmission gate T5 is an output of the NOR gate NOR2, and applied to a PMOS gate thereof is an output of the NOR gate NOR1. The latch R3 latches an output of the transmission gate T5 for a certain time.

The output controller 120 is provided with transmission gates T6 and T20, an inverter IV4, a latch R1 and a NAND gate ND1. The transmission gate T6 is switched contemporaneously with the transmission gate T5 and selectively passes an output of the latch portion 110 according to output states of the NOR gates NOR1 and NOR2. Input to an NMOS gate of the transmission gate T6 is an output of the NOR gate NOR1, and input to a PMOS gate thereof is an output of the NOR gate NOR2. Input to an NMOS gate of the transmission gate T20 is the bypass signal BYPASS, and input to a PMOS gate thereof is an inverted signal of the bypass signal BYPASS. The inverter IV4 inverts an output of the transmission gate T6 to produce an output signal OUT. The NAND gate ND1 NAND-operates an output of a NAND gate ND2 included in the latch controller 130 and the output signal OUT to feedback an output signal to an input terminal of the inverter IV4.

The latch controller 130 is provided with inverters IV5 and IV6 and the NAND gate ND2. The inverter IV5 inverts the data DATA and the inverter IV6 inverts the bypass signal BYPASS. The NNAD gate ND2 NAND-operates an output of the inverter IV5 and the bypass signal BYPASS to delivery an output signal to the latch R1 contained in the output controller 120.

Hereinafter, an operation of the present invention having the construction as mentioned above will be described in detail.

If the bypass signal BYPASS is logic high, the input controller 100 outputs a logic low signal regardless of the clocks CLK and CLKB. In response to the logic low signal, the transmission gates T5 and T6 are all turned off and thus an output of the latch controller 130 becomes logic high, thus outputting the data DATA.

On the other hand, if the bypass signal BYPASS is logic low, the latch controller 130 outputs a logic high or low signal according to a level of the data DATA. In response to the logic high or low signal, the transmission gates T5 and T6 are selectively switched by the clocks CLK and CLKB regardless of whether the data DATA is of logic high or low, thus performing the same operation as the general flip-flop.

In other words, when the bypass signal BYPASS is logic low, if the clock CLK is logic low and the clock CLKB is logic high, the transmission gate T5 is turned on for the latch R3 to latch the data DATA. And, if the clock CLK is logic high and the clock CLKB is logic low, the transmission gate T6 is turned on to invert the data applied to the latch portion 110 and provide inverted data as the output signal OUT.

As described above, the present invention outputs the data DATA regardless the clocks CLK and CLKB if the bypass signal BYPASS is logic high, and provides the output signal OUT depending on the clocks CLK and CLKB regardless the data DATA if the bypass signal BYPASS is logic low. Therefore, the present invention can remove the transmission gate at the bypass stage, to avoid the problem of the prior art. Accordingly, a margin of the signal transfer time can be improved because no additional inverter stage is needed.

For example, if the bypass flip-flop circuit of the present invention operates at a frequency of 1 GHz, it is assumed that the data DATA is output at a rising edge of the clock CLK. In this case, a driving time of only one inverter IV4 is required. Thus, assuming that a set-up time of the next stage is 100 ps and a delay time of the inverter is 200 ps, the present invention can obtain a margin of 700 ps, while the prior art obtains a margin of 200 ps. Accordingly, the present invention can improve a signal delay transfer margin totaling 350%, compared to the prior art.

Figure 3:
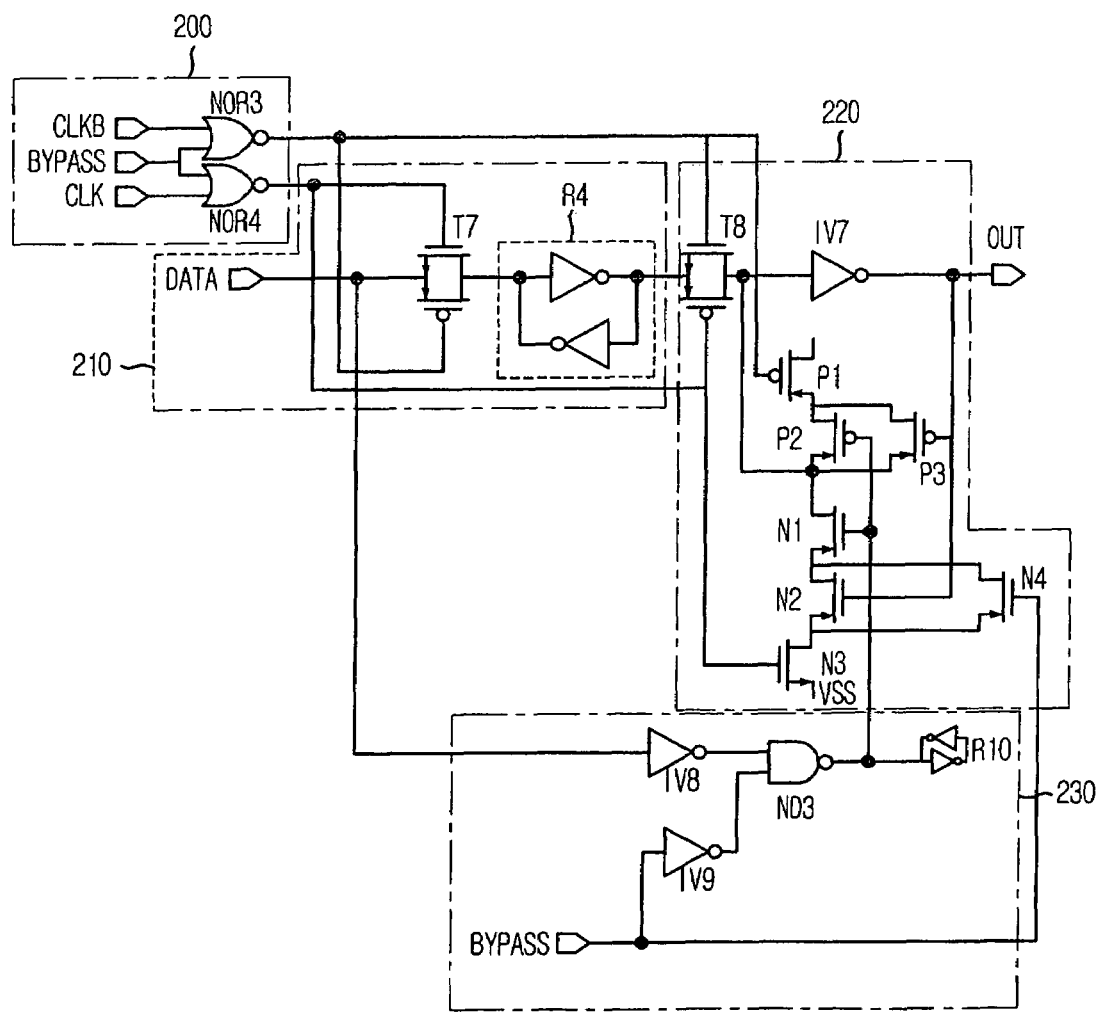
FIG. 3 is a circuit diagram of a flip-flop circuit in accordance with another embodiment of the present invention.

FIG. 3 is a circuit diagram of a flip-flop circuit in accordance with another embodiment of the present invention.

As exemplified therein, the flip-flop circuit of the present invention includes an input controller 200, a latch portion 210, an output controller 220 and a latch controller 230.

The input controller 200 is provided with NOR gates NOR3 and NOR4 for NOR-operating clocks CLK and CLKB and a bypass signal BYPASS. The NOR gate NOR3 NOR-operates the clock CLKB and the bypass signal BYPASS. The NOR gate NOR4 NOR-operates the clock CLK and the bypass signal BYPASS.

The latch portion 210 is composed of a transmission gate T7 and a latch R4. The transmission gate T7 selectively allows an output of data DATA depending on output states of the NOR gates NOR3 and NOR4. Applied to an NMOS gate of the transmission gate T7 is an output of the NOR gate NOR4, and applied to a PMOS gate thereof is an output of the NOR gate NOR3. The latch R4 latches an output of the transmission gate T7 for a certain time.

The output controller 220 is provided with a transmission gate T8, an inverter IV7, and PMOS transistors P1 to P3 and NMOS transistors N1 to N4, which serve as a switching device. The transmission gate T8 is switched contemporaneously with the transmission gate T7 and selectively passes an output of the latch portion 210 according to output states of the NOR gates NOR3 and NOR4. Input to an NMOS gate of the transmission gate T8 is an output of the NOR gate NOR3, and input to a PMOS gate thereof is an output of the NOR gate NOR4. The inverter IV7 inverts an output of the transmission gate T8 to produce an output signal OUT.

The PMOS transistor P1 is connected between a power supply voltage VDD input terminal and the PMOS transistor P2 and accepts an output of the NOR gate NOR3 via its gate. The PMOS transistor P2 is coupled between the PMOS transistor P1 and the NMOS transistor N1 and receives an output of a NAND gate ND3 included in the latch controller 230 via its gate. The PMOS transistor P3 is connected in parallel with the PMOS transistor P2 and takes the output signal OUT via its gate. The NMOS transistors N1 to N3 are connected in series between the PMOS transistor P2 and a ground voltage VSS input terminal; and accepts via their gates an output of the NAND gate ND3, the output signal OUT and an output of the NOR gate NOR4, respectively. Te NMOS transistor N4 is connected in parallel with the NMOS transistor N2 and receives the bypass signal BYPASS via its gate.

The latch controller 230 is provided with inverters IV8 and IV9, the NAND gate ND3 and a latch R10. The inverter IV8 inverts the data DATA and the inverter IV6 inverts the bypass signal BYPASS. The NAND gate ND3 NAND-operates outputs of the inverters IV8 and IV9 to provide an output signal to the gates of the PMOS transistor P2 and the NMOS transistor N1. The latch R10 latches the output of the NAND gate ND3.

Hereinafter, an operation of the present invention having the construction as described above will be described in detail.

If the bypass signal BYPASS is logic high, the input controller 200 outputs a logic low signal regardless of the clocks CLK and CLKB. In response to the logic low signal, the transmission gates T7 and T8 are turned off and thus an output of the latch controller 230 becomes logic high, regardless of a level of the data DATA.

In succession, the PMOS transistor P1 and the NMOS transistor N1 are turned on, and the NMOS transistor N3 is maintained to be in the turn-off state. Thus, the data DATA can be output according to a selective switching operation of the PMOS transistor P3 and the NMOS transistor N2.

If the bypass signal BYPASS is logic low, the latch controller 230 outputs a logic high or low signal relying on a level of the data DATA. In response to the logic high or low signal, the transmission gates T7 and T8 are selectively switched by the clocks CLK and CLKB regardless of whether the data DATA is logic high or low, thus performing the same operation as the general flip-flop.

In other words, when the bypass signal BYPASS is logic low, if the clock CLK is logic low and the clock CLKB is logic high, the transmission gate T7 is turned on for the latch R4 to latch the data DATA. At this time, if the data DATA is logic high, the output of the latch controller 230 becomes logic high, thus turning on the NMOS transistor N1. The output of the NOR gate NOR4 becomes logic high and thus the NMOS transistor N3 becomes logic high. In this state, if the output signal OUT is logic high, the NMOS transistor N2 is turned on and an input of the inverter IV7 becomes logic high; and if the output signal OUT is logic low, the input of the inverter IN7 becomes logic high.

On the other hand, if the clock CLK is logic high and the clock CLKB is logic low, the transmission gate T8 is turned on, which inverts data applied to the latch 210 and provides inverted data as the output signal OUT.

As described above, the present invention has an advantage in that it can achieve a stable signal transfer during a high-frequency operation by improving a signal transfer delay margin of a bypass flip-flop circuit.

The present application contains subject matter related to Korean patent application No. 2005-91665 & 2005-134193, filed in the Korean Patent Office on Sep. 29 & Dec. 29, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A flip-flop circuit, comprising:
   an input controller for logically operating a bypass signal and a clock to produce first and second output signals having different logic states depending on whether or not the bypass signal is activated;
   a latch circuit for latching input data based on the first and the second output signals;
   a latch controller for logically operating the bypass signal and the input data to generate a third output signal having a bistable logic state depending on whether or not the bypass signal is activated; and
   an output controller switched in response to the logic states of the first and the second output signals for selectively outputting a signal provided from the latch circuit, and logically combining an output signal and the third output signal to provide the output signal.

2. The flip-flop circuit as recited in claim 1, wherein the input data is output regardless of the state of the clock if the bypass signal is logic high and the output signal is provided based on the state of the clock regardless of the input data if the bypass signal is logic low.

3. The flip-flop circuit as recited in claim 1, wherein the input controller outputs the first and the second output signals of logic low levels regardless of the state of the clock if the bypass signal is logic high, and provides the first and the second output signals of logic high or logic low levels depending on the state of the clock if the bypass signal is logic low.

4. The flip-flop circuit as recited in claim 3, wherein the input controller includes:
   a first logic device for logically operating the bypass signal and an inverted signal of the clock; and
   a second logic device for logically operating the bypass signal and the clock.

5. The flip-flop circuit as recited in claim 4, wherein the first logic device is a first NOR gate.

6. The flip-flop circuit as recited in claim 4, wherein the second logic device is a second NOR gate.

7. The flip-flop circuit as recited in claim 1, wherein the latch circuit includes:
   a first transmission gate switched in response to the logic states of the first and the second output signals for selectively outputting the input data; and
   a latch for latching an output signal of the first transmission gate.

8. The flip-flop circuit as recited in claim 7, wherein the transmission gate is configured to accept the second output signal via an NMOS gate and the first output signal via a PMOS gate.

9. The flip-flop circuit as recited in claim 1, wherein the latch controller is provided with a logic device for logically operating the bypass signal and an inverted signal of the data.

10. The flip-flop circuit as recited in claim 9, wherein the logic device is a first NAND gate.

11. The flip-flop circuit as recited in claim 1, wherein the latch controller outputs a logic high signal regardless of the input data if the bypass signal is logic high, and provides a logic high or logic low signal depending on a logic level of the input data if the bypass signal is logic low.

12. The flip-flop circuit as recited in claim 1, wherein the output controller includes:
   a first transmission gate switched in response to the logic states of the first and the second output signals for selectively outputting the signal provided from the latch circuit;
   a first inverter for inverting an output of the first transmission gate to generate the output signal;
   a logic device for logically operating the output signal and the third output signal;
   a second transmission gate switched in response to the logic states of the output signal and the bypass signal for selectively passing the output signal; and
   a latch for latching the third output signal.

13. The flip-flop circuit as recited in claim 12, wherein the logic device is a NAND gate.

14. The flip-flop circuit as recited in claim 1, wherein the output controller includes:
   a first transmission gate switched in response to the logic states of the first and the second output signals for selectively outputting the signal provided from the latch circuit;
   a first inverter for inverting an output of the first transmission gate to generate the output signal; and
   a switching circuit selectively switched in response to the first and the second output signals, the output signal, and the third output signal for controlling a level of an input terminal of the first inverter.

15. The flip-flop circuit as recited in claim 14, wherein the switching circuit includes:
   a first switching device connected between a power supply voltage terminal and a first node for receiving the first output signal via a gate terminal;
   a second switching device connected between the first node and an input terminal of the first inverter for receiving the third output signal via a gate terminal;

a third switching device connected in parallel with the second switching device for accepting the output signal via a gate terminal;

a fourth switching device connected between the input terminal of the first inverter and a second node for receiving the third output signal via a gate terminal;

a fifth switching device connected between the second node and a third node for receiving the output signal via a gate terminal;

a sixth switching device connected between the third node and a ground voltage terminal for receiving the second output signal via a gate terminal; and a seventh switching device connected in parallel with the sixth switching device for receiving the bypass signal via a gate terminal.

16. The flip-flop circuit as recited in claim 15, wherein the first switching device is a PMOS transistor.

17. The flip-flop circuit as recited in claim 15, wherein the second switching device is a PMOS transistor.

18. The flip-flop circuit as recited in claim 15, wherein the third switching device is a PMOS transistor.

19. The flip-flop circuit as recited in claim 15, wherein the fourth switching device is an NMOS transistor.

20. The flip-flop circuit as recited in claim 15, wherein the fifth switching device is an NMOS transistor.

21. The flip-flop circuit as recited in claim 15, wherein the sixth switching device is an NMOS transistor.

22. The flip-flop circuit as recited in claim 15, wherein the seventh switching device is an NMOS transistor.

* * * * *